United States Patent
Kusuyama (10) Patent No.: US 6,947,226 B2
(45) Date of Patent: Sep. 20, 2005

(54) OPTICAL LENS-USE BASE MATERIAL, OPTICAL LENS, AND METHOD OF PRODUCING OPTICAL LENS

(75) Inventor: Yutaka Kusuyama, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/476,866

(22) PCT Filed: May 8, 2002

(86) PCT No.: PCT/JP02/04497

§ 371 (c)(1),
(2), (4) Date: Nov. 5, 2003

(87) PCT Pub. No.: WO02/091037

PCT Pub. Date: Nov. 14, 2002

(65) Prior Publication Data

US 2004/0130791 A1 Jul. 8, 2004

(30) Foreign Application Priority Data

May 9, 2001 (JP) .................................... P2001-139220
May 9, 2001 (JP) .................................... P2001-139228

(51) Int. Cl.$^7$ .......................... G02B 7/02; G02B 13/18; B29D 1/12; C03C 23/00
(52) U.S. Cl. .......................... 359/811; 264/2.7; 65/111; 359/710
(58) Field of Search .............................. 264/1.29, 1.32, 264/2.7; 65/111, 403; 359/619, 626, 710, 811

(56) References Cited

U.S. PATENT DOCUMENTS

| | | | |
|---|---|---|---|
| 4,986,939 A | 1/1991 | Hoffmann .................... 264/1.7 |
| 5,004,328 A | 4/1991 | Suzuki et al. ................. 350/416 |
| 5,080,706 A | 1/1992 | Snyder et al. ................. 65/102 |
| 5,081,639 A | 1/1992 | Snyder et al. ............... 372/101 |
| 5,155,631 A | 10/1992 | Snyder et al. ............... 359/708 |
| 5,293,269 A | 3/1994 | Burkhart et al. ............. 359/719 |
| 5,450,244 A * | 9/1995 | Fantone ....................... 359/710 |
| 5,513,201 A | 4/1996 | Yamaguchi et al. .......... 372/75 |
| 5,745,519 A | 4/1998 | Ruda et al. .................. 372/101 |
| 5,790,576 A | 8/1998 | Waarts et al. ................. 372/43 |
| 5,867,327 A | 2/1999 | Snyder ........................ 359/710 |
| 6,222,864 B1 | 4/2001 | Waarts et al. ................. 372/43 |
| 6,384,981 B1 | 5/2002 | Hauschild .................... 359/622 |
| 6,471,372 B1 | 10/2002 | Lissotschenko et al. .... 362/268 |

FOREIGN PATENT DOCUMENTS

| | | |
|---|---|---|
| EP | 0 752 394 A2 | 1/1997 |
| GB | 2 108 483 A | 5/1983 |
| JP | 57-145040 | 9/1982 |
| JP | 57-169706 | 10/1982 |
| JP | 57-175739 | 10/1982 |
| JP | 57-181516 | 11/1982 |
| JP | 57-183328 | 11/1982 |
| JP | 58-168026 | 10/1983 |

(Continued)

Primary Examiner—David N. Spector
(74) Attorney, Agent, or Firm—Drinker Biddle & Reath LLP (57) ABSTRACT

The method of making an optical lens in accordance with the present invention comprises an optical lens preform producing step of producing an optical lens preform 40 having a plurality of curved surface parts 43 formed parallel to each other, and a pair of flanges 48 formed on both sides of the plurality of curved surface parts 43; a drawing step of drawing the optical lens preform 40; and an optical lens producing step of producing an optical lens 1 by cutting the drawn optical lens preform 40; wherein the plurality of curved surface parts 43 of the optical lens preform 40 drawn by the drawing step function as an optically effective part. In such a method, the form of the optically effective part can be determined in the stage of the preform before drawing, whereby the optically effective part can be processed in a sufficiently large size.

9 Claims, 7 Drawing Sheets

FOREIGN PATENT DOCUMENTS

| | | |
|---|---|---|
| JP | 59-092935 | 5/1984 |
| JP | 63-008233 | 1/1988 |
| JP | 07-15521 | 12/1990 |
| JP | 6-2311 | 1/1994 |
| JP | 6-15016 | 2/1994 |
| JP | 07-098402 | 4/1995 |
| JP | 07-287104 | 10/1995 |
| JP | 07-291651 | 11/1995 |
| JP | 09-118532 | 5/1997 |
| JP | 10-001321 | 1/1998 |
| JP | 10-096803 | 4/1998 |
| JP | 10-245236 | 9/1998 |
| JP | 2000-098191 | 4/2000 |
| JP | 3121614 | 1/2001 |
| WO | WO 92/06046 | 4/1992 |
| WO | WO 97/21126 | 6/1997 |
| WO | WO 01/35126 A1 | 5/2001 |
| WO | WO 01/35145 A1 | 5/2001 |
| WO | WO 01/35147 A1 | 5/2001 |
| WO | WO 02/090274 A1 | 11/2002 |

* cited by examiner

OPTICAL LENS-USE BASE MATERIAL, OPTICAL LENS, AND METHOD OF PRODUCING OPTICAL LENS

TECHNICAL FIELD

The present invention relates to an optical lens acting on light emitted from a light-emitting device, and a method of making the optical lens.

BACKGROUND ART

Japanese Patent Publication No. 3121614 and U.K. Patent Publication GB2108483A disclose methods of making a microlens by drawing. Such a method forms a cylindrical preform, and heats and draws the preform, thereby forming a cylindrical lens having a cross-sectional form identical to that of the preform.

DISCLOSURE OF THE INVENTION

The inventor studied the prior art mentioned above and, as a result, has found the following problem. Namely, such a conventional type method of making an optical lens has been inconvenient in that the preform deforms by generating distortions and the like in the process of drawing, whereby an optically effective part acting on the light may not be formed as designed.

In order to overcome the problem mentioned above, it is an object of the present invention to provide a method of making an optical lens which can restrain the preform from being deformed by drawing. It is another object of the present invention to provide an optical lens comprising an optically effective part accurately acting on light.

The present invention provides an optical lens preform for drawing, the optical lens preform being constructed by a light-transparent material into a columnar form comprising first to fourth side faces; at least one of the first side face and the third side face opposite from the first side face including a curved surface part formed parallel to a column axis, and a pair of flanges formed on both sides of the curved surface part.

Since corner parts which are likely to deform under the influence of heating due to drawing are formed with a pair of flanges in such an optical lens preform, the pair of flanges are influenced by the heating, whereas each curved surface part acting as an optically effective part can be kept from being influenced.

Here, the "column axis of the columnar form" refers to a line segment passing the geometric center of gravity in each of the upper face 41a and bottom face 41b (see FIG. 1A) of the preform.

The curved surface part may be constituted by a plurality of curved surface parts arranged in contact with each other.

Preferably, any cross section perpendicular to the column axis of the optical lens preform is oblong. As a consequence, the second and fourth side faces become parallel to each other, thereby making it easier to carry out an optical lens arranging step which will be explained later. Here, "oblong" refers to a form which is considered oblong if the first and third curved surfaces are assumed to be planar without taking account of the curved surface parts formed therein. For example, it encompasses the form indicated by the upper face 41a in FIG. 1A.

The curved surface part may be formed as an aspheric surface.

Preferably, each flange has a projection protruded beyond the curved surface part. As a consequence, when drawing the optical lens preform by a roller, the optical lens preform can stably be held by way of the projections of the pair of flanges, whereby the optical lens preform can be prevented from wobbling at the time of drawing. The optical lens made by drawing such an optical lens preform has projections corresponding to those of the preform, and thus can prevent curved surface parts from coming into direct contact with an arrangement surface on which the optical lens is disposed, side faces of members adjacent to the optical lens, and the like. As a consequence, curved surface parts acting on light are harder to damage and so forth, and performances of outgoing light are kept from lowering.

Preferably, at least one of the first and third side faces is formed into a convex surface. When an optical lens preform is drawn, side faces thereof may be distorted so as to retract. Forming at least one of the first and third side faces into a convex surface can suppress the influence of distortion due to the drawing.

The present invention provides a method of making an optical lens, the method comprising an optical lens preform producing step of producing the optical lens preform; a drawing step of drawing the optical lens preform produced by the optical lens preform producing step; and an optical lens producing step of producing an optical lens by cutting the optical lens preform drawn by the drawing step; wherein the curved surface part of the optical lens preform drawn by the drawing step functions as an optically effective part acting on incident light or outgoing light.

In such a method of making an optical lens, the form of the optical lens, the form of the optically effective part in particular, can be determined in the stage of the preform before drawing, whereby the optically effective part can be processed in a sufficiently large size. Here, "acting on light" refers to changing the angle of divergence or convergence of incident light and emitting thus changed light, or changing the optical path of the incident light.

The optical lens producing step may include a flange cutting step of cutting off the pair of flanges from the optical lens produced by cutting the optical lens preform drawn by the drawing step. This realizes an optical lens having removed parts adversely affected by deformation and the like upon heating in the drawing step.

The optical lens producing step may include an optical lens arranging step of preparing a plurality of optical lenses having the pair of flanges cut off by the flange cutting step, and arranging the optical lenses into an array by bonding the respective second and fourth side faces to each other. This realizes an optical lens comprising a number of curved surface parts. Also, since a pair of flanges are cut off from each of the individual optical lenses arranged, an optical lens having eliminated the adverse effects due to the heating in the drawing is realized.

Preferably, the drawing step carries out drawing by using heating means with an annular form surrounding the optical lens preform produced by the optical lens preform producing step, whereas the heating means comprises a ring form corresponding to a cross-sectional form in a cross section perpendicular to the column axis of the optical lens preform. Since the heating means comprises the ring form corresponding to the form of the optical lens preform, the heating temperature does not concentrate at corner parts of the optical lens preform. Here, the "ring form corresponding to a cross-sectional form perpendicular to the column axis of the preform" refers to a form in which the distance from each side face of the preform to the heating means is the same as shown in FIG. 5B.

The optical lens in accordance with the present invention is produced by any of the above-mentioned methods of making an optical lens.

The present invention will become more fully understood from the detailed description given hereinbelow and the accompanying drawings. They are given by way of illustration only, and thus should not be considered limitative of the present invention.

BRIEF DESCRIPTION OF THE DRAWINGS

FIG. 5A is a schematic sectional view of the drawing step in the method of making an optical lens in accordance with the first embodiment, whereas

BEST MODES FOR CARRYING OUT THE INVENTION

In the following, embodiments of the present invention will be explained in detail with reference to the drawings. In the following explanation, parts identical or equivalent to each other will be referred to with numerals identical to each other without repeating their overlapping descriptions.

Figure 1A:
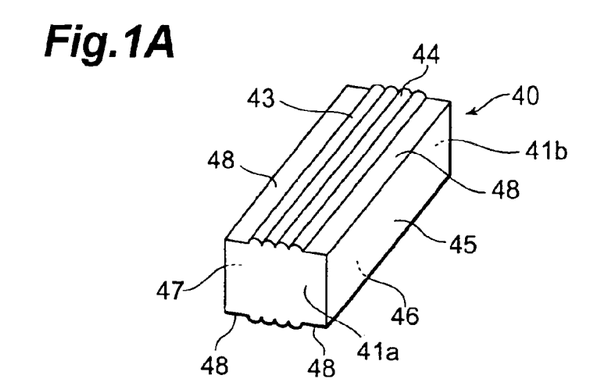
FIGS. 1A to 1C are schematic views showing respective steps in the method of making an optical lens in accordance with a first embodiment.
Figure 1B:
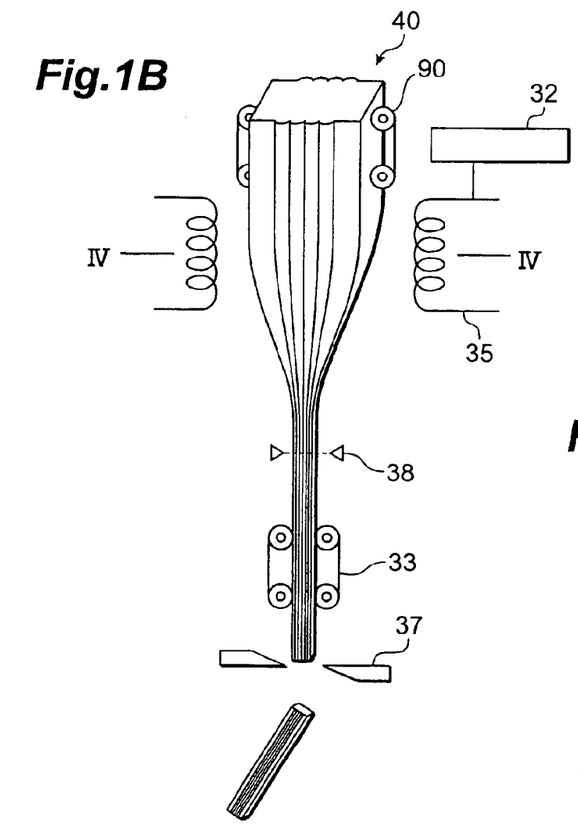
Figure 1C:
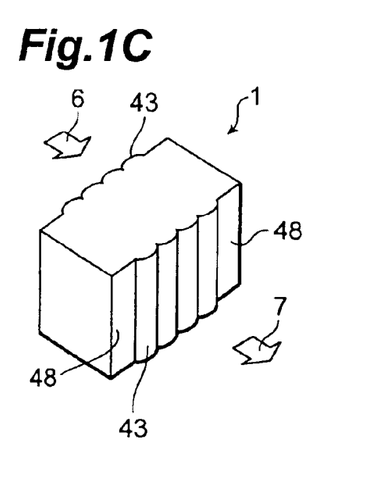

FIGS. 1A to 1C are schematic views showing respective steps in the method of making an optical lens in accordance with a first embodiment. As shown in FIG. 1A, an optical member made of a light-transparent glass material is initially prepared, and is shaped into a quadrangular prism comprising a first side face 44 to a fourth side face 47, thus forming an optical lens preform 40 (optical lens preform producing step). Any cross section perpendicular to the column axis of the optical lens preform 40 is in the same oblong form. Therefore, the first side face 44 and third side face 46 are parallel to each other, the second side face 45 and fourth side face 47 are parallel to each other, the first side face 44 and second side face 45 are at right angles, and the third side face 46 and fourth side face 47 are at right angles.

The first side face 44 and third side face 46 are formed with a plurality of curved surface parts 43, parallel to the column axis, in contact with each other. The plurality of curved surface parts 43 are convex surfaces, and function as an optically effective part acting on incident light or outgoing light after being drawn. The convex surfaces may be aspheric surfaces. Each of the first side face 44 and third side face 46 is further formed with a pair of flanges 48 on both sides of the plurality of curved surface parts 43 (at corner parts of the optical lens preform 40). Though the corner parts of the optical lens preform 40 are likely to deform and so forth under the influence of the heating in the drawing step, the plurality of curved surface parts 43 themselves are less likely to be influenced by the heating in the optical lens preform 40 in accordance with this embodiment, since the pair of flanges 48 are formed. This effect will be explained later.

Thus, in the method of making an optical lens by drawing, the form of an optical lens to be produced, the form of the optically effective part in particular, can be shaped in the stage of the optical lens preform 40 having a sufficiently large size (e.g., a width of 5 to 6 cm and a length of 20 cm), whereby these operations can be carried out in a simple and accurate manner.

Japanese Patent Publication No. HEI 7-15521 discloses a method of making a refractive index distribution type cylindrical lens (SELFOC lens) by drawing. This method employs, as a preform, a high-purity silica glass rod in which the fluorine dopant amount increases stepwise from the center to the radially outer side, so that the refractive index decreases stepwise accordingly, and does not use a preform formed with an optically effective part in terms of shape as in the present invention. Though such a conventional method necessitates, as a step of producing a preform, a step of doping it with fluorine by outside plasma method or immersing it into a molten salt for a long time so as to effect ion exchange, thereby forming a refractive index distribution, such a step is unnecessary in the present invention. The conventional method is also different from the present invention in terms of the resulting optical lens 1 in that the light entrance and exit surfaces are not the curved surfaces of a cylindrical form and both end parts thereof are used.

Subsequently, as shown in FIG. 1B, the optical lens preform 40 shaped by the optical lens preform producing step is melted upon heating by an electric furnace 35 or the like acting as heating means, and is drawn so as to attain a desirable diameter (drawing step). Preferably, the electric furnace 35 has an annular form surrounding the optical lens preform 40, and evenly heats and melts the optical lens preform 40 from thereabout. A temperature regulator 32 is connected to the electric furnace 35, whereby the temperature of the electric furnace 35 can be changed so as to adjust the drawing temperature. Feeding rollers 90 and pulling rollers 33 are used for drawing and expanding the heated optical lens preform 40. When drawing an optical lens preform having a quadrangular prism form as mentioned above, the optical lens preform 40 can be prevented from twisting during drawing if the second side face 45 and fourth side face 47 are held by the feeding rollers 90 and pulling rollers 33.

Figure 2:
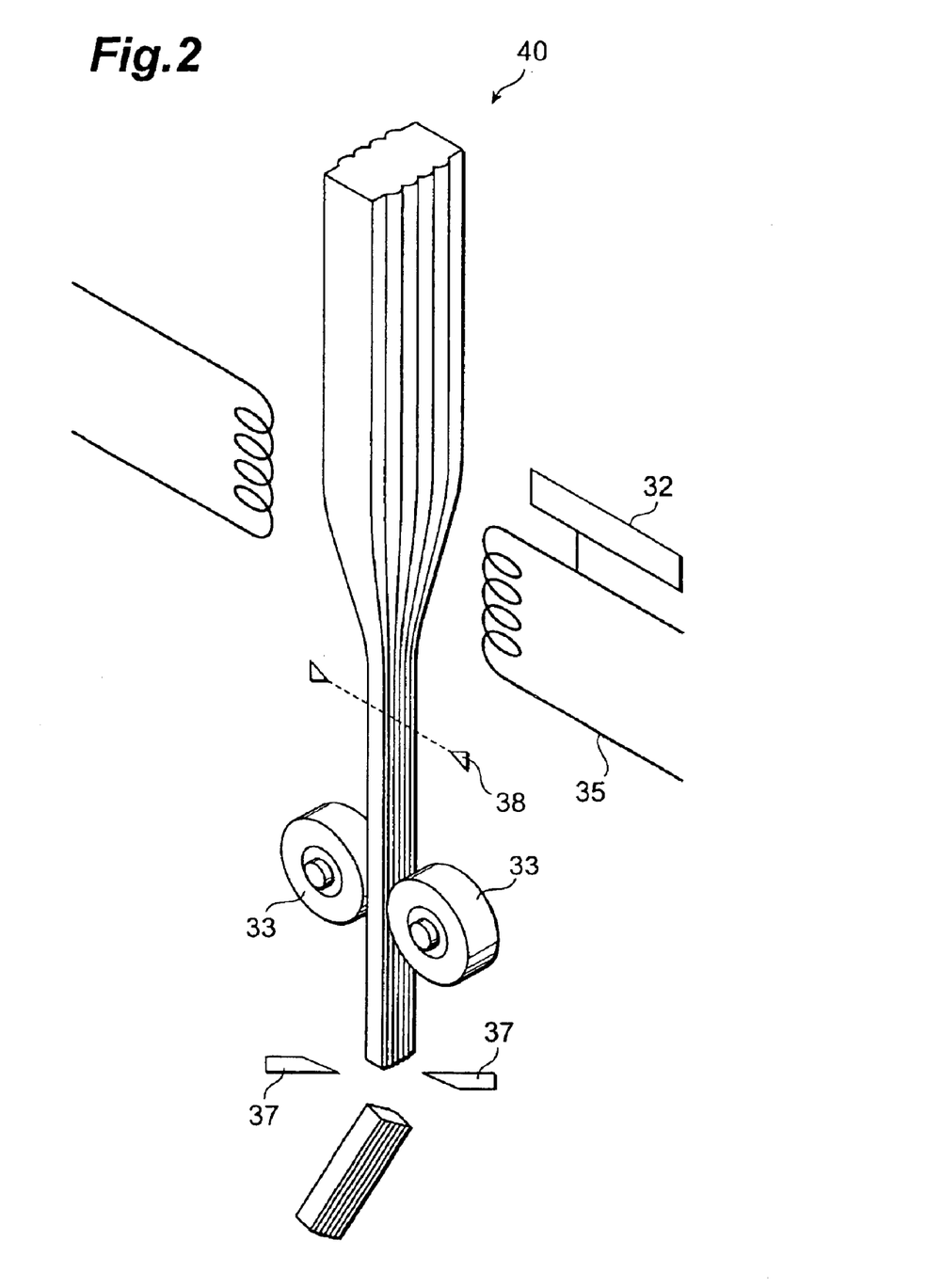
FIG. 2 is a view showing another example of drawing.

Also, as shown in FIG. 2, the optical lens preform 40 may be pulled by the pulling rollers 33 for drawing.

When it is determined that the outer diameter of the optical lens preform 40 has attained a desirable width (0.5 to 15 mm) as a result of drawing, the optical lens preform 40 is cut by a cutter 37 placed below the pulling rollers 33. This determination is carried out by a diameter meter 38 disposed upstream the pulling rollers 33. The diameter meter 38 comprises a laser section for emitting laser light, a light-receiving section for receiving the laser light transmitted through the optical lens preform 40, and an analyzing section for calculating the outer diameter of the optical lens preform 40 from the quantity of light received by the light-receiving section and the like. The optical lens formed by cutting with the cutter 37 has a rod shape with a length of 5 mm to 2000 mm, which may be in a size employed as an optical lens or a size in a stage before being cut or shaved into a desirable length (optical lens producing step). The optical lens is likely to break when too long, and is inconvenient for cutting and shaving when too short. Though the drawn product is wound about a drum or the like when making an optical fiber or the like, the making of an optical lens is characterized by cutting the drawn product as such.

Thus produced optical lens 1 has a cross-sectional form identical to that of the optical lens preform 40 because of characteristics of drawing. After drawing, the optical lens, the optically effective parts 43 constituted by a convex surface in particular, is not subjected to shaping except for cutting into a desirable length and grinding on the outer periphery, whereby the burden on manufacture can be alleviated. As shown in FIG. 1C, incident light 6 is collimated or converged by the optically effective parts 43 (curved surface parts 43 in the preform stage) formed on the light entrance side and light exit side, and thus collimated or converged light is emitted as outgoing light 7. Here, the directions of the incident light 6 and outgoing light 7 maybe reversed. Since the optical lens 1 comprising four curved surfaces as the optically effective part 43 is formed in this embodiment, light beams emitted from a semiconductor laser array acting as a light-emitting device having four light-emitting parts arranged therein can be collimated or converged, for example, and thus collimated or converged light beams can be emitted.

Figure 3A:
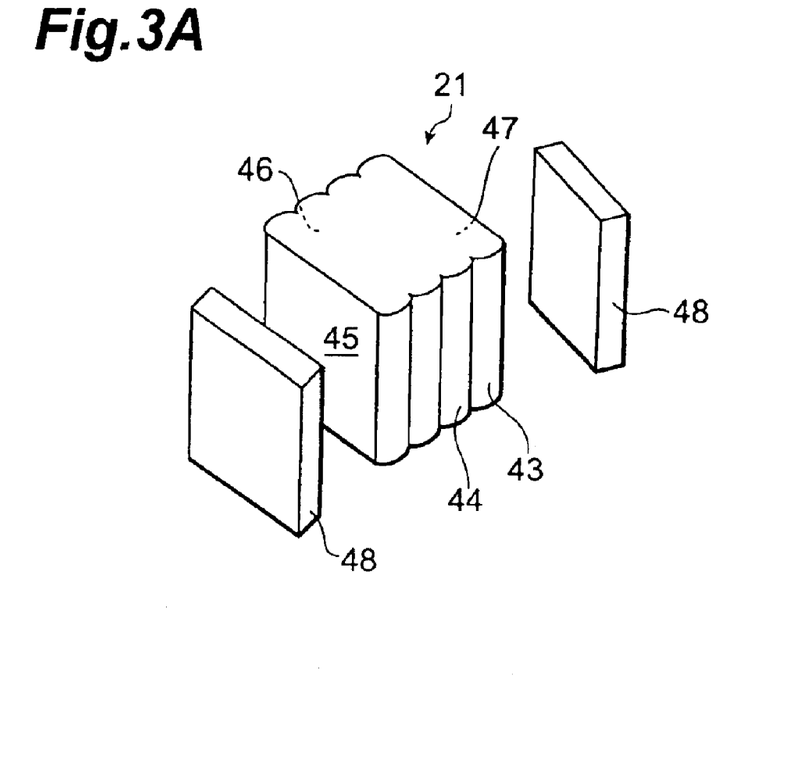
FIGS. 3A and 3B are schematic views showing respective steps in the method of making an optical lens in accordance with a second embodiment.

FIGS. 3A and 3B are schematic views showing respective steps in the method of making an optical lens in accordance with a second embodiment. These steps follow those of FIGS. 1A to 1C. In the method of making an optical lens in accordance with the second embodiment, as shown in FIG. 3A, the pair of flanges 48 are initially cut off from the optical lens 1 produced in FIG. 1C (flange cutting step), so as to yield an optical lens 21. As mentioned above, the flanges 48 incur (or may incur) influences such as deformation upon heating in the drawing step. Therefore, cutting off such a pair of flanges 48 realizes an optical lens which is more compact than the optical lens 1 shown in FIG. 1C and free of adverse effects (such as deformation) upon heating. In the optical lens 21 in accordance with the second embodiment, as depicted, the optically effective part 43 comprises four convex surfaces 43, whereby respective light beams emitted from four light-emitting parts arranged in a light-emitting device can be converged or collimated, and thus converged or collimated light beams can be emitted.

Figure 3B:
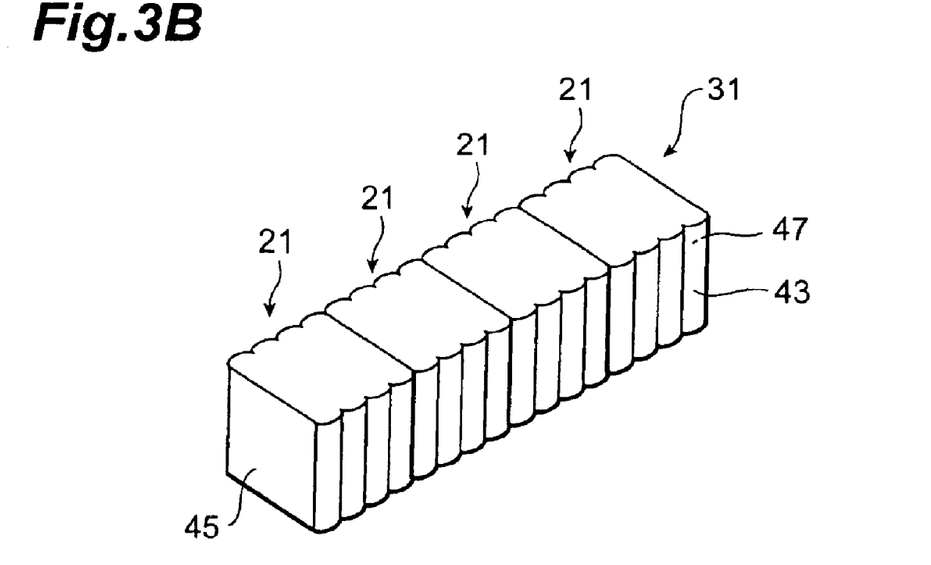

Further, as shown in FIG. 3B, a plurality of optical lenses 21 each having cut off the pair of flanges 48 as shown in FIG. 3A may be prepared and arranged into an array by bonding their second side faces 45 and fourth side faces 47 to each other (optical lens arranging step). Since the flanges 48 have already been cut by the flange cutting step, an optical lens 31 having curved surfaces arranged with the same pitch width is formed by simply arranging the plurality of optical lenses 21 while bringing their side faces into contact with each other (and bonding them). Since the adverse effects (such as deformation) upon heating in the drawing step are eliminated at the point of the optical lens 21, thus formed optical lens 31 is also free of the adverse effects upon heating in the drawing step. The optical lens 31 in accordance with the second embodiment comprises four optical lenses 21 arranged therein, and thus can respond to 4×4=16 incident light beams. Namely, it can collimate or converge light beams from a light-emitting device comprising 16 light-emitting parts, and emit thus collimated or converged light beams. Since the second side faces 45 and fourth side faces 47 are parallel to each other, an operation of arranging a plurality of optical lenses into an array while bringing them into contact with each other is easily carried out.

Figure 4A:
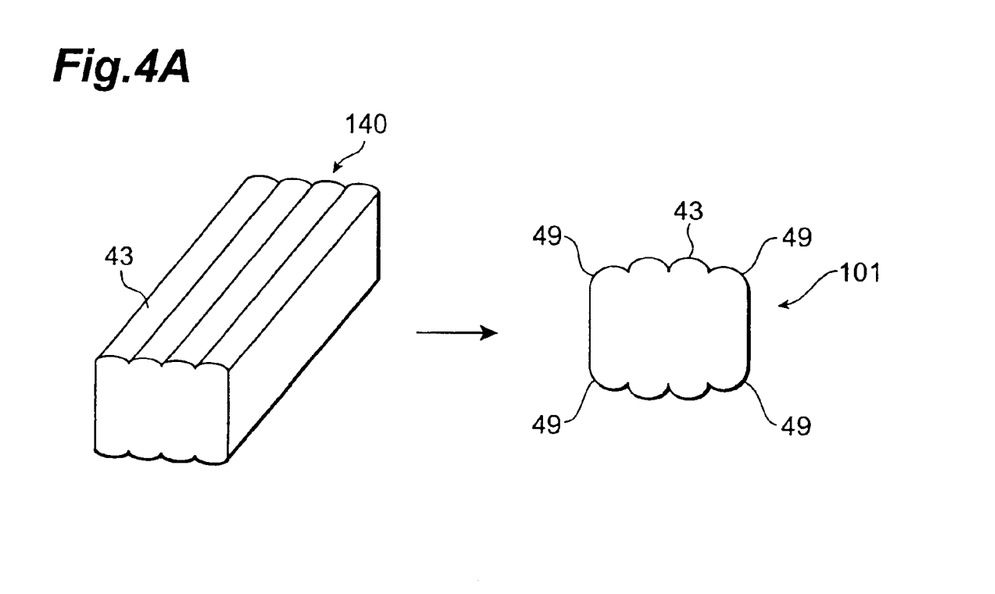
FIGS. 4A and 4B are views showing effects of the methods of making an optical lens in accordance with the first and second embodiments.
Figure 4B:
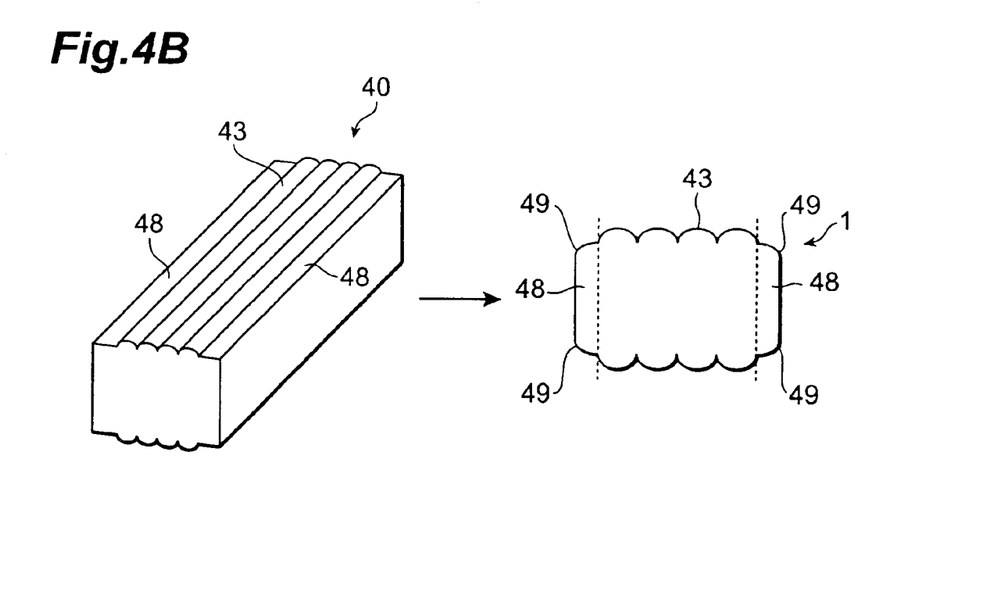

FIGS. 4A and 4B are views showing effects of the methods of making an optical lens in accordance with the first and second embodiments. FIG. 4A shows an optical lens preform 140 in accordance with a comparative example, and a cross section of an optical lens 101 produced by drawing from the optical lens preform 140. FIG. 4B shows the optical lens preform 40 in accordance with the embodiments, and a cross section of the optical lens 1 produced by drawing from the optical lens preform 40.

As shown in FIG. 4A, the optical lens preform 140 in accordance with the comparative lens has no flange. Heating is likely to concentrate at corner parts 49 of the preform, thus yielding a high temperature. Therefore, upon drawing, the curved surface parts 43 located at the corner parts 49 are deformed under the influence of the heating temperature. Thus deformed curved surface parts 43 do not function as an optically effective part as intended in the designing stage. By contrast, as shown in FIG. 4B, a pair of flanges 48 are formed on both sides of the plurality of curved surface parts 43, i.e., at corner parts 49 of the optical lens preform 40 in the methods of making an optical lens in accordance with the embodiments. Therefore, upon drawing, the pair of flanges 48 deform under the influence of heating in the drawing step, whereby the form of curved surface parts 43 is kept even after the drawing. Thus, in the methods of making an optical lens in accordance with the embodiments, a pair of flanges 48 are provided, so as to receive adverse effects due to the heating at the time of the drawing step, thereby protecting the plurality of curved surface parts 43, which will function as optically effective parts after the drawing. Therefore, it is not necessary for the flanges 48 to have a flat form. For example, curved surface parts 43 formed in excess may be employed as flanges 48 to be cut off when affected by the heating upon drawing.

Figure 5A:
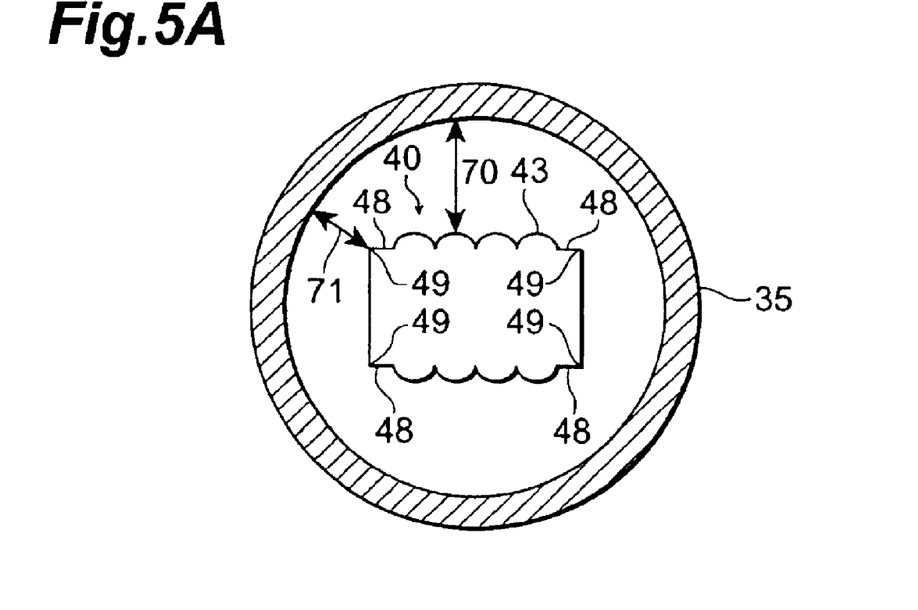
Figure 5B:
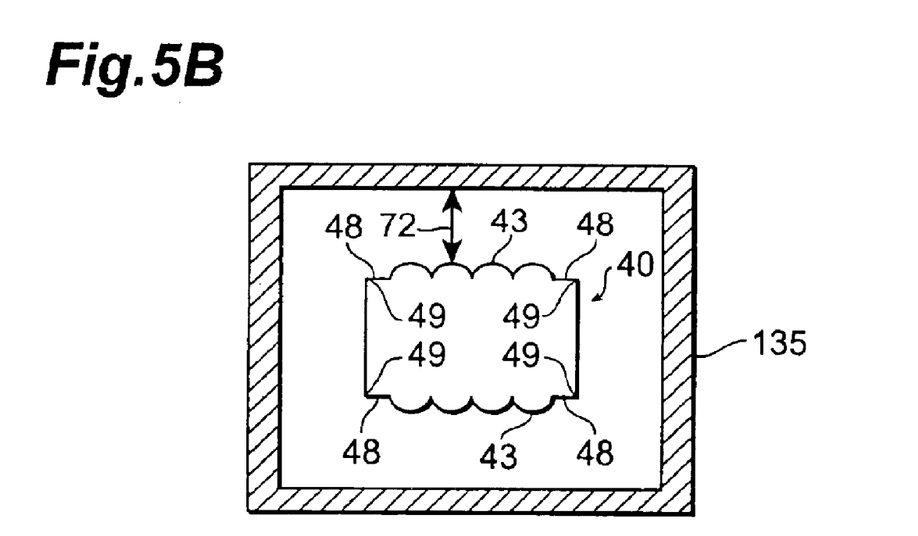
FIG. 5B is a schematic sectional view of the drawing step in the method of making an optical lens in accordance with a third embodiment.

FIG. 5A is a schematic sectional view of the drawing step in the method of making an optical lens in accordance with the first embodiment, whereas FIG. 5B is a schematic sectional view of the drawing step in the method of making an optical lens in accordance with a third embodiment. FIG. 5A is also a sectional view taken along the line IV—IV of FIG. 1B. In the drawing step in the method of making an optical lens in accordance with the first embodiment, as shown in FIG. 5A, the electric furnace 35 acting as the heating means is formed like a ring surrounding the optical lens preform 40, and the ring is circular. Therefore, the distance 71 from each corner part 49 to the electric furnace 35 is shorter than the distance 70 from each curved surface part 43 to the electric furnace 35. Such a shorter distance to the electric furnace acting as a heat source may cause the corner parts 49 to attain a temperature higher than that of other parts, thereby deforming the corner parts 49 of the optical lens preform 40.

In the drawing step in the method of making an optical lens in accordance with the third embodiment as shown in FIG. 5B, by contrast, the electric furnace 135 acting as the heating means has a form corresponding to the cross-sectional form of the optical lens preform 40, i.e., such a form that the side faces 44 to 47 of the optical lens preform 40 have the same distance to the electric furnace 135 at any parts, at the corners 49 in particular (the distance in this case referring to the shortest distance to the electric furnace 135 without taking account of the curved surface parts 43 formed in the first side face 44 and third side face 46). This prevents the corner parts 49 from being solely located closer to the electric furnace 135, whereby the heating temperature is evenly applied to the individual parts of the optical lens preform 40 in the drawing step. Namely, this also ameliorates inconveniences in which the heating temperature is concentrated at the corner parts 49 so as to deform the optical lens preform 40 in the drawing step. The electric furnace 135 having such a form is further effective when the optical lens preform 40 has a horizontal size longer than the vertical size thereof.

Though the present invention is specifically explained in the foregoing with reference to the first to third embodiments, the present invention is not limited to the embodiments, which merely illustrate the best modes for carrying out the invention, but includes all the alterations of the invention falling within the scope of claims of the invention and can be modified in terms of form, size, arrangement, and the like.

Figure 6A:
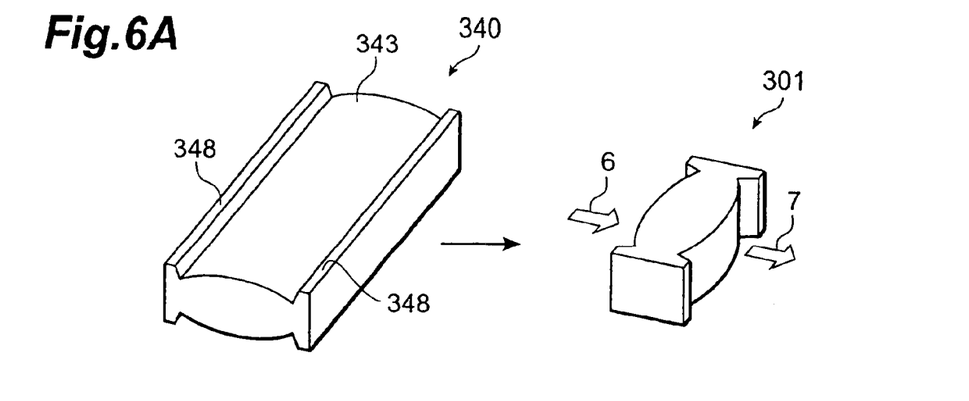
FIGS. 6A to 6C are views each showing an optical lens preform comprising a single curved surface, and an optical lens produced by drawing the optical lens preform.
Figure 6B:
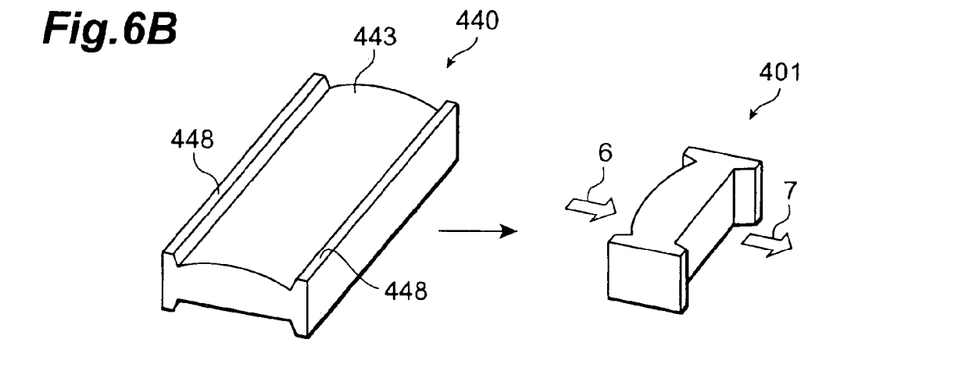
Figure 6C:
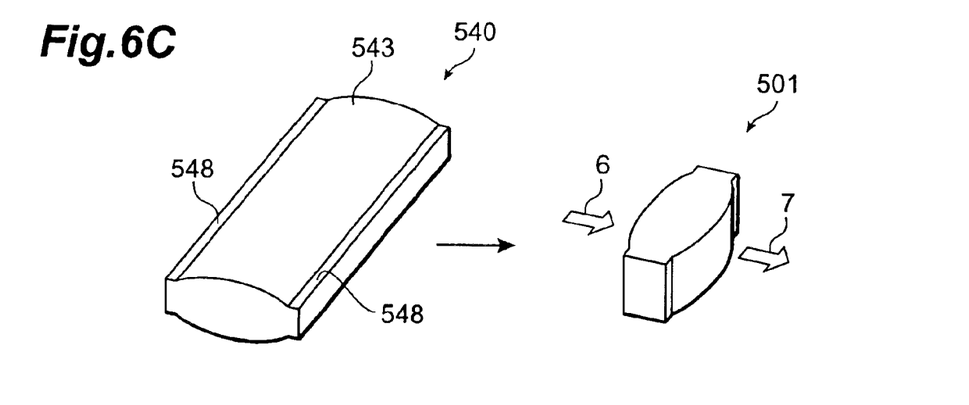

For example, as in the optical lens preforms 340, 440, 540 shown in FIGS. 6A to 6C, single curved surfaces 343, 443, 543 may be provided.

Also, in terms of the flange form, the flanges may have projections 348, 448 protruded from the curved surface parts 343, 443 as shown in FIGS. 6A, 6B. In this case, upon drawing as shown in FIG. 2, the optical lens preforms 340, 440 can stably be held by the rollers 33 by way of a pair of projections 348, 448, and thus can be prevented from wobbling at the time of drawing. Also, the rollers 33 and the curved surface parts can be kept from interfering with each other. Further, since the optical lenses 301, 401 made by drawing such optical lens preforms 340, 440 have protrusions corresponding to the projections 348, 448 of the preforms 340, 440, the curved surface parts 343, 443 can be prevented from coming into direct contact with an arrangement surface on which the optical lenses 301, 401 are disposed, side faces of members adjacent to the optical lenses 301, 401, and the like. This makes the curved surface parts 343, 443, which act on light, harder to damage and so forth, and prevents performances of outgoing light from deteriorating.

Also, as in the curved surface part 443 shown in FIG. 6B, the curved surface part maybe provided on one side alone. On the right side, FIGS. 6A to 6C show respective optical lenses 301, 401, 501 formed by drawing the optical lens preforms 340, 440, 540 shown on the left side.

Figure 7:
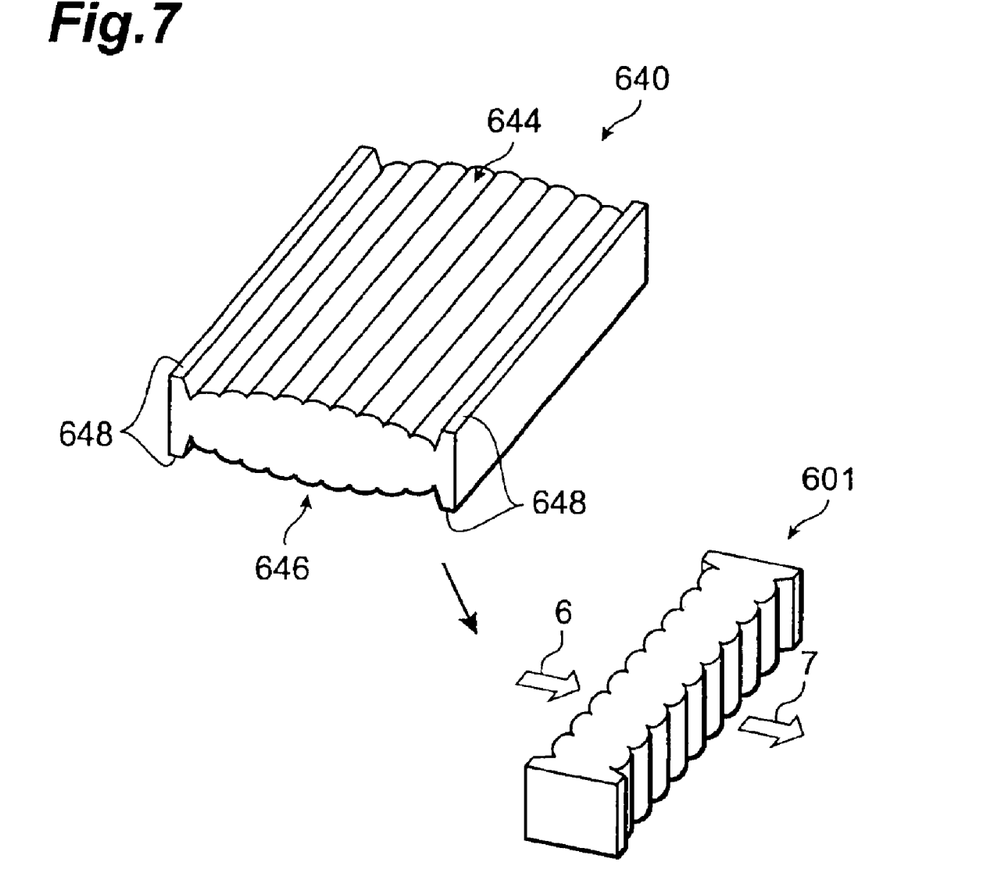
FIG. 7 is a view showing an optical lens preform suppressing the distortion due to drawing, and an optical lens produced by drawing the optical lens preform.

As in the optical lens preform 640 shown in FIG. 7, each of the first side face 644 and third side face 646 as a whole may be formed into a convex surface. Here, when each of the first side face 644 and third side face 646 comprises a plurality of curved surface parts, each of the first side face 644 and third side face 646 is considered to be in a convex surface form if a surface in contact with all of the plurality of curved surface parts is a convex surface. Though flat surface parts (first to fourth side faces) of an optical lens preform may deform to retract upon drawing, forming the first side face 644 and third side face 646 into a convex surface beforehand yields an optical lens 601 (on the right side of FIG. 7) having eliminated the distortion due to the drawing.

The flanges of the optical lens preform shown in FIG. 7 also have projections 648 protruded from the curved surface parts. Therefore, when drawn as shown in FIG. 2, the rollers 33 can stably hold the optical lens preform 640 by way of a pair of projections 648, whereby the optical lens preform 640 can be prevented from wobbling at the time of drawing. Also, the rollers 33 and the curved surface parts can be prevented from interfering with each other. Further, the optical lens 601 made by drawing such an optical lens preform 640 has projections corresponding to the projections 648 of the preform 640, and thus can prevent the curved surface parts from coming into direct contact with an arrangement surface on which the optical lens 601 is disposed, side faces of members adjacent to the optical lens 601, or the like. As a consequence, curved surface parts acting on light are harder to damage and so forth, and performances of outgoing light are kept from lowering.

From the foregoing explanations of the invention, it will be obvious that the same may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

In the method of making an optical lens in accordance with the present invention, the form of the optical lens, the form of the optically effective part in particular, can be determined in the stage of the preform before drawing, whereby the optically effective part can be processed in a sufficiently large size, and the form of the optical lens, the form of the optically effective part in particular, can easily be shaped. This realizes an optical lens having an optically effective part accurately acting on light. Also, the burden on manufacture can be alleviated.

Further, in the optical lens preform, corner parts which are likely to be influenced by heating in the drawing step so as to deform and so forth are formed with flanges, whereby each curved surface part acting as an optically effective part can be kept from being influenced by heating. This realizes an optical lens whose optically effective part is not deformed by the drawing step.

What is claimed is:

1. An optical lens preform for drawing, the optical lens preform being constructed by a light-transparent material into a columnar form comprising first to fourth side faces;
    at least one of the first side face and the third side face opposite from the first side face including a curved surface part formed parallel to a column axis, and a pair of flanges formed on both sides of the curved surface part, the curved surface part being constituted by a plurality of curved surface parts arranged in contact with each other.

2. An optical lens preform according to claim 1, wherein any cross section perpendicular to the column axis of the optical lens preform is oblong.

3. An optical lens preform according to claim 1, wherein the curved surface part is formed as an aspheric surface.

4. An optical lens preform according to claim 1, wherein the flange has a projection protruded beyond the curved surface part.

5. An optical lens preform according to claim 1, wherein at least one of the first and third side faces is formed into a convex surface.

6. A method of making an optical lens, the method comprising:
    an optical lens preform producing step of producing an optical lens preform, the optical lens preform being constructed by a light-transparent material into a columnar form comprising first to fourth side faces, at least one of the first side face and the third side face opposite from the first side face including a curved surface part formed parallel to a column axis, and a pair of flanges formed on both sides of the curved surface part, the curved surface part being constituted by a plurality of curved surface parts arranged in contact with each other;

a drawing step of drawing the optical lens preform produced by the optical lens preform producing step; and an optical lens producing step of producing an optical lens by cutting the optical lens preform drawn by the drawing step, the cutting including a flange cutting step of cutting off the pair of flanges from the optical lens.

7. A method of making an optical lens according to claim 6, wherein the optical lens producing step includes an optical lens arranging step of preparing a plurality of optical lenses having the pair of flanges cut off by the flange cutting step, and arranging the optical lenses into an array by bonding the respective second and fourth side faces to each other.

8. A method of making an optical lens according to claim 6, wherein the drawing step carries out drawing by using heating means with an annular form surrounding the optical lens preform produced by the optical lens preform producing step, the heating means comprising a ring form corresponding to a cross-sectional form in a cross section perpendicular to the column axis of the optical lens preform.

9. An optical lens produced by the method of making an optical lens according to claim 6.

* * * * *